(12) United States Patent
Lin et al.

(10) Patent No.: US 9,006,730 B2
(45) Date of Patent: Apr. 14, 2015

(54) METAL OXIDE SEMICONDUCTOR STRUCTURE AND PRODUCTION METHOD THEREOF

(75) Inventors: Chin-Wen Lin, Jhunan Township, Miaoli County (TW); Chuan-I Huang, Taipei (TW); Chung-Chin Huang, Pingtung (TW); Ted Hong Shinn, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 350 days.

(21) Appl. No.: 13/101,983

(22) Filed: May 5, 2011

(65) Prior Publication Data

US 2012/0181532 A1 Jul. 19, 2012

(30) Foreign Application Priority Data

Jan. 13, 2011 (TW) .............................. 100101206 A

(51) Int. Cl.
*H01L 29/12* (2006.01)
*H01L 29/786* (2006.01)

(52) U.S. Cl.
CPC ................................ *H01L 29/7869* (2013.01)

(58) Field of Classification Search
USPC ............................ 257/E29.296, E21.461, 43
See application file for complete search history.

(56) References Cited

U.S. PATENT DOCUMENTS

| 7,281,860 B2 * | 10/2007 | Fujita ............................... 385/88 |
| 7,674,650 B2 * | 3/2010 | Akimoto et al. ............... 438/104 |
| 2011/0065216 A1 * | 3/2011 | Kaji et al. ........................ 438/16 |

* cited by examiner

*Primary Examiner* — Thien F Tran
(74) *Attorney, Agent, or Firm* — Guice Patents PLLC

(57) ABSTRACT

A metal oxide semiconductor structure and a production method thereof, the structure including: a substrate; a gate electrode, deposited on the substrate; a gate insulation layer, deposited over the gate electrode and the substrate; an IGZO layer, deposited on the gate insulation layer and functioning as a channel; a source electrode, deposited on the gate insulation layer and being at one side of the IGZO layer; a drain electrode, deposited on the gate insulation layer and being at another side of the IGZO layer; a first passivation layer, deposited over the source electrode, the IGZO layer, and the drain electrode; a second passivation layer, deposited over the first passivation layer; and an opaque resin layer, deposited over the source electrode, the second passivation layer, and the drain electrode.

11 Claims, 5 Drawing Sheets

METAL OXIDE SEMICONDUCTOR STRUCTURE AND PRODUCTION METHOD THEREOF

BACKGROUND OF THE INVENTION

1. Field of the Invention

The present invention relates to a metal oxide semiconductor structure, especially to a metal oxide semiconductor structure having an opaque resin layer and at least two passivation layers.

2. Description of the Related Art

As IGZO (In—Ga—Zn—O) thin film transistor—utilizing IGZO for channel material—can be easily deposited on a glass substrate, many displays have utilized IGZO thin film transistors for controlling the gray levels of pixels. Please refer to FIG. 1, which illustrates a sectional view of a prior art thin film transistor structure. As illustrated in FIG. 1, the thin film transistor structure 100 includes a glass substrate 101, a gate electrode 102, a gate insulation layer 103, an IGZO layer 104, a source electrode 105a, a drain electrode 105b, a passivation layer 106, and a resin layer 107.

In the structure, the glass substrate 101 is used for carrying the other compositions of the thin film transistor structure.

The gate electrode 102, made of metal and deposited on the glass substrate 101, is used for coupling to a gate driving signal.

The gate insulation layer 103, being an insulation layer deposited over the gate electrode 102 and the glass substrate 101, is used to insulate the gate electrode 102 from the IGZO layer 104, the source electrode 105a, and the drain electrode 105b.

The IGZO layer 104, being an N type semiconductor layer deposited on the gate insulation layer 103, functions as a channel.

The source electrode 105a, made of metal and deposited at one side of the IGZO layer 104, is used for coupling to a source driving signal.

The drain electrode 105b, made of metal and deposited at another side of the IGZO layer 104, is used for coupling to a pixel electrode.

The passivation layer 106, made of a silicon compound and deposited over the source electrode 105a, the IGZO layer 104, and the drain electrode 105b, is used for reducing leakage current of the channel.

The resin layer 107, being a transparent resin layer deposited over the source electrode 105a, the passivation layer 106, and the drain electrode 105b, is used to form a protection layer.

However, the thin film transistor structure specified above still suffers from photo leakage current effect. As illustrated in FIG. 2, the leakage current caused by a fourth light intensity—a strong light, with the thin film transistor being in a bias condition of $V_{gs}=0V$ and $V_{ds}=15V$, is around 0.1 mA. In addition, the thin film transistor structure also suffers from degradation caused by invasion of moisture, oxygen, or hydrogen—whose amount increases with time, and the degradation will further increase the leakage current. As illustrated in FIG. 3, in same test condition, the leakage current measured on a first date (June 22) is around $10^{-13}$ A, while the leakage current measured on a second date (July 15)—23 days later—is around $10^{-6}$ A.

To conquer the flaws of the prior art thin film transistor structure mentioned above, the present invention proposes a novel metal oxide semiconductor structure, which utilizes a better shielding design for preventing light, moisture, and air from reaching the channel, thereby reducing the photo leakage current and avoiding the degradation of the channel.

SUMMARY OF THE INVENTION

One objective of the present invention is to disclose a metal oxide semiconductor structure, which can effectively prevent light, moisture, and air from reaching the channel, and thereby reduce the leakage current.

Another objective of the present invention is to disclose a method of making a metal oxide semiconductor structure, wherein the metal oxide semiconductor structure can effectively prevent light, moisture, and air from reaching the channel, and thereby reduce the leakage current.

To attain the foregoing objectives, a metal oxide semiconductor structure is proposed, the metal oxide semiconductor structure including a substrate, a gate electrode, a gate insulation layer, an IGZO layer, a source electrode, a drain electrode, a first passivation layer, a second passivation layer, and an opaque resin layer.

The substrate is used for carrying the other compositions of the metal oxide semiconductor structure.

The gate electrode, made of metal and deposited on the substrate, is used for coupling to a gate driving signal.

The gate insulation layer, being an insulation layer deposited over the gate electrode and the substrate, is used for insulating the gate electrode from the IGZO layer, the source electrode, and the drain electrode.

The IGZO layer, being an N type semiconductor layer deposited on the gate insulation layer, functions as a channel.

The source electrode, made of metal and deposited at one side of the IGZO layer, is used for coupling to a source driving signal.

The drain electrode, made of metal and deposited at another side of the IGZO layer, is used for coupling to a pixel electrode.

The first passivation layer, being a first silicon compound layer deposited over the source electrode, the IGZO layer, and the drain electrode, possesses excellent insulating property.

The second passivation layer, being a second silicon compound layer deposited over the first passivation layer, possesses excellent moisture-resistant and air-resistant properties.

The resin layer, being an opaque resin layer deposited over the source electrode, the second passivation layer, and the drain electrode, is used for forming a protection layer to prevent light, moisture, or dust from entering the structure.

To attain the foregoing objectives, a method of making a metal oxide semiconductor structure is proposed, the method including the following steps:

Step a: depositing a gate electrode on a substrate.

Step b: depositing a gate insulation layer over the gate electrode and the substrate.

Step c: depositing an IGZO layer on the gate insulation layer, wherein the IGZO layer functions as a channel.

Step d: depositing a source electrode at one side of the IGZO layer.

Step e: depositing a drain electrode at another side of the IGZO layer.

Step f: depositing a first passivation layer over the source electrode, the IGZO layer, and the drain electrode.

Step g: depositing a second passivation layer over the first passivation layer.

Step h: depositing an opaque resin layer over the source electrode, the second passivation layer, and the drain electrode.

To attain the foregoing objectives, another method of making a metal oxide semiconductor structure is proposed, the method including the following steps:

Step a: depositing a gate electrode on a substrate.

Step b: depositing a gate insulation layer over the gate electrode and the substrate.

Step c: depositing a source electrode at one side of the gate insulation layer.

Step d: depositing a drain electrode at another side of the gate insulation layer.

Step e: depositing an IGZO layer over the source electrode, the gate insulation layer, and the drain electrode, wherein the IGZO layer functions as a channel.

Step f: depositing a first passivation layer over the source electrode, the IGZO layer, and the drain electrode.

Step g: depositing a second passivation layer over the first passivation layer.

Step h: depositing an opaque resin layer over the source electrode, the second passivation layer, and the drain electrode.

To make it easier for our examiner to understand the objective of the invention, its structure, innovative features, and performance, we use preferred embodiments together with the accompanying drawings for the detailed description of the invention.

DETAILED DESCRIPTION OF THE PREFERRED EMBODIMENTS

The present invention will be described in more detail hereinafter with reference to the accompanying drawings that show the preferred embodiments of the invention.

Figure 1:
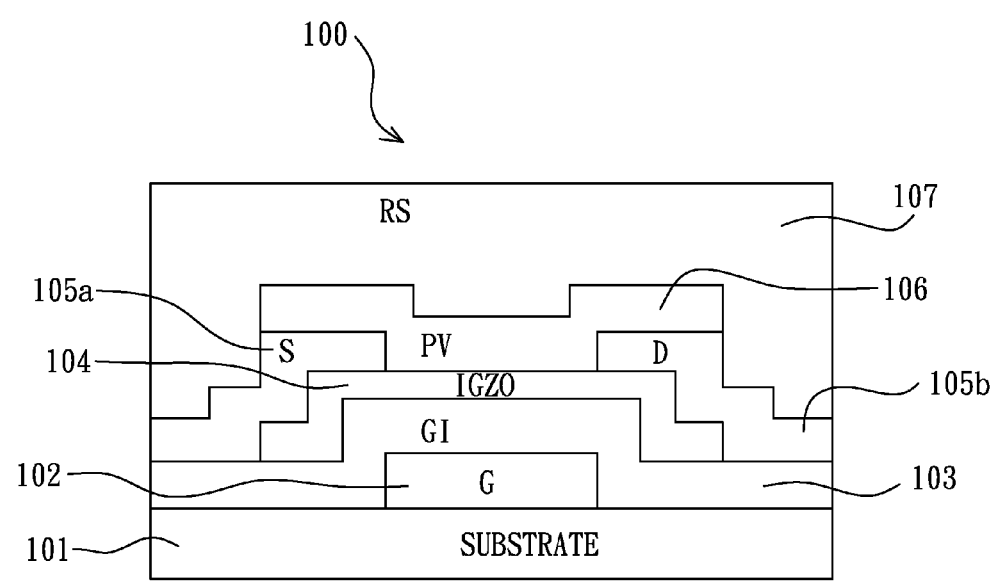
FIG. 1 illustrates a sectional view of a prior art thin film transistor structure.
Figure 2:
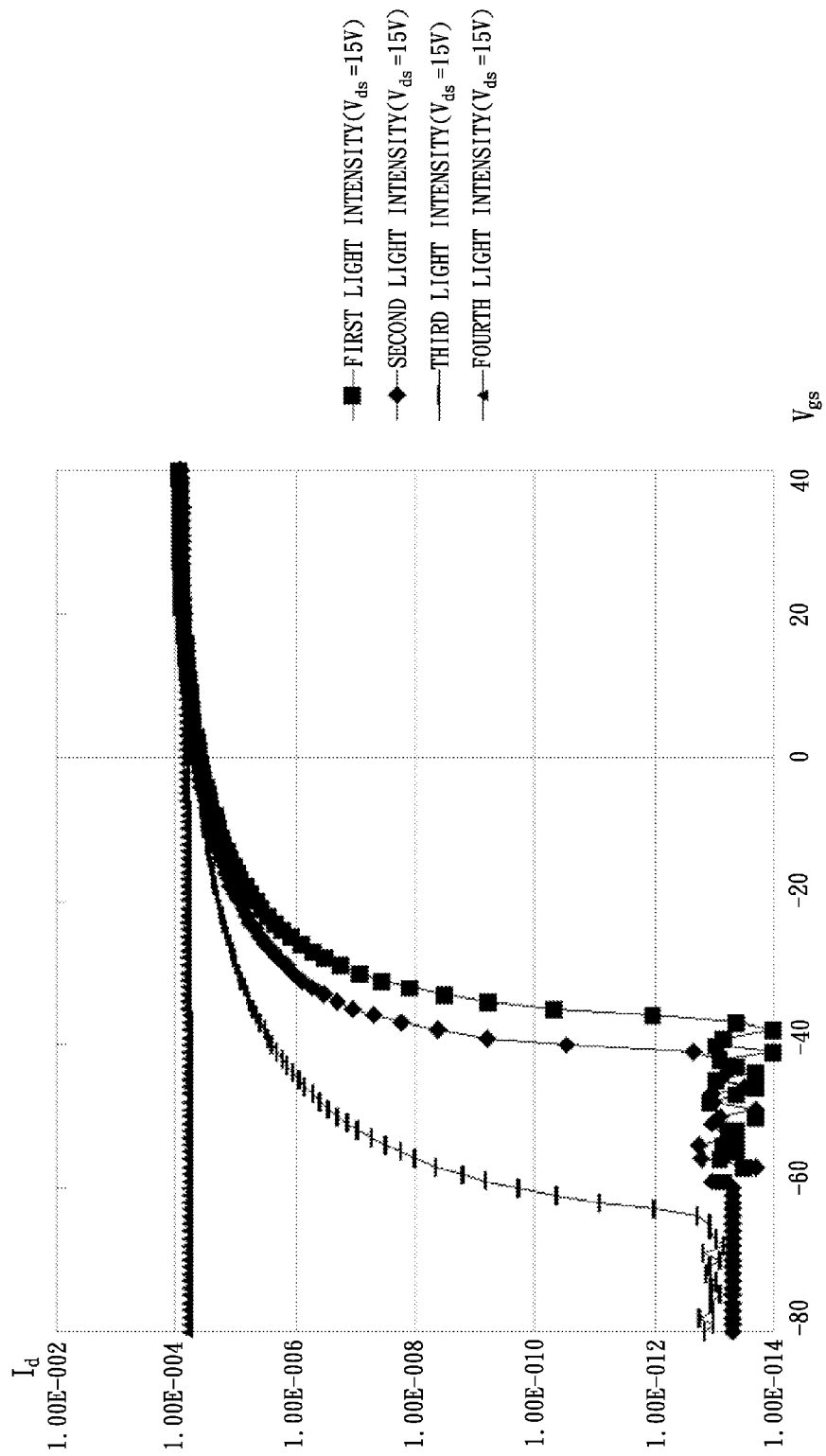
FIG. 2 illustrates photo leakage current effect of the thin film transistor structure in FIG. 1.
Figure 3:
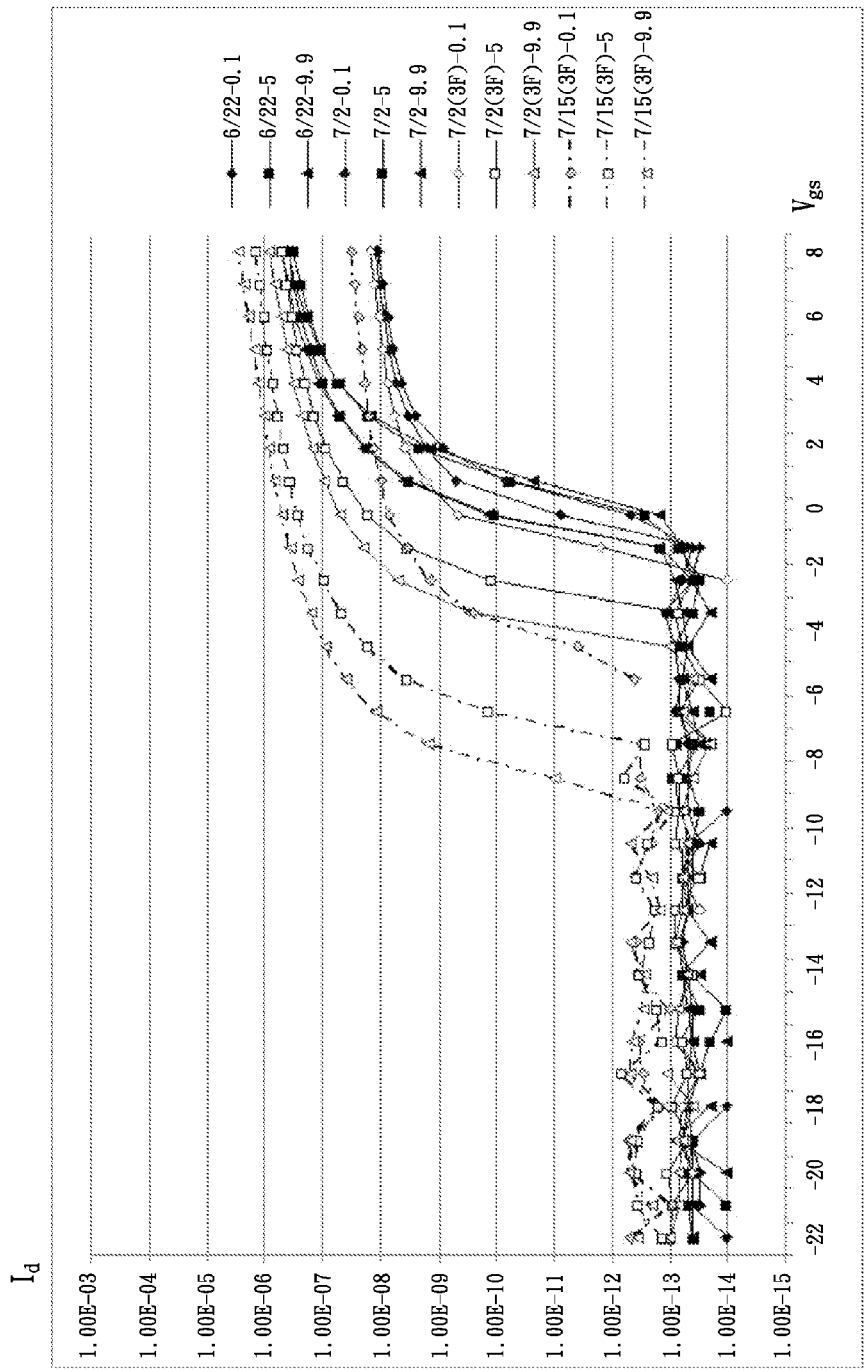
FIG. 3 illustrates degradation effect on leakage current of the thin film transistor structure in FIG. 1.
Figure 4:
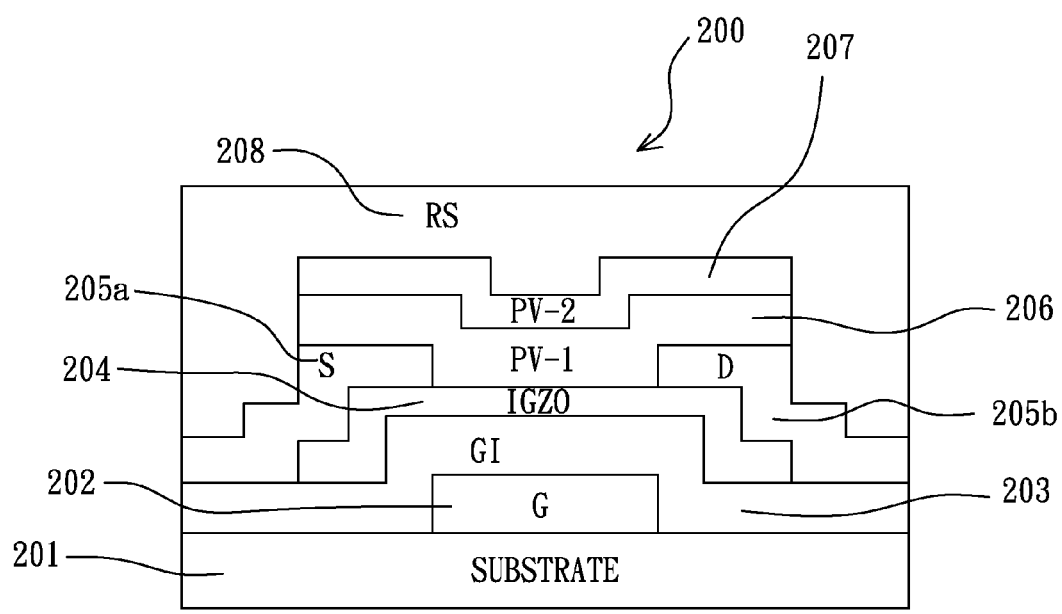
FIG. 4 illustrates a sectional view of a metal oxide semiconductor structure according to a preferred embodiment of the present invention.

Please refer to FIG. 4, which illustrates a sectional view of a metal oxide semiconductor structure according to a preferred embodiment of the present invention. As illustrated in the figure, the metal oxide semiconductor structure 200 includes a substrate 201, a gate electrode 202, a gate insulation layer 203, an IGZO layer 204, a source electrode 205a, a drain electrode 205b, a first passivation layer 206, a second passivation layer 207, and an opaque resin layer 208.

The substrate 201, of which the material includes glass or flexible plastics, is used for carrying the other compositions of the metal oxide semiconductor structure.

The gate electrode 202, made of metal—preferably an opaque metal, implemented by Mo/Cr alloy or Al/Nd alloy, for example—and deposited on the substrate 201, is used for coupling to a gate driving signal.

The gate insulation layer 203, being an insulation layer deposited over the gate electrode 202 and the substrate 201, has an upward bending portion in the middle region. The insulation layer including silicon oxides or silicon nitrides, is used for insulating the gate electrode 202 from the IGZO layer 204, the source electrode 205a, and the drain electrode 205b.

The IGZO layer 204, being an N type semiconductor deposited on the gate insulation layer 203 and functioning as a channel, has an upward bending portion in the middle region.

The source electrode 205a, made of metal and deposited at one side of the IGZO layer 204, has a stair-stepping outline and is used for coupling to a source driving signal. The metal is preferably an opaque metal, implemented by Mo/Cr alloy or Al/Nd alloy, for example.

The drain electrode 205b, made of metal and deposited at another side of the IGZO layer 204, has a stair-stepping outline and is used for coupling to a pixel electrode. The metal is preferably an opaque metal, implemented by Mo/Cr alloy or Al/Nd alloy, for example.

The first passivation layer 206, being a first silicon compound layer deposited over the source electrode 205a, the IGZO layer 204, and the drain electrode 205b, has a downward bending portion in the middle region and possesses excellent insulating property. The first silicon compound layer preferably includes silicon oxides.

The second passivation layer 207, being a second silicon compound layer deposited over the first passivation layer 206, has a downward bending portion in the middle region and possesses excellent moisture-resistant and air-resistant properties. The second silicon compound layer preferably includes silicon nitrides—due to the fact that silicon nitride, of which the density is higher than that of silicon oxide, can provide better moisture-resistant and air-resistant effects.

The resin layer 208, being an opaque resin layer—preferably in black color—deposited over the source electrode 205a, the second passivation layer 207, and the drain electrode 205b, is used for forming a protection layer to prevent light, moisture, or dust from entering the structure.

Figure 5:
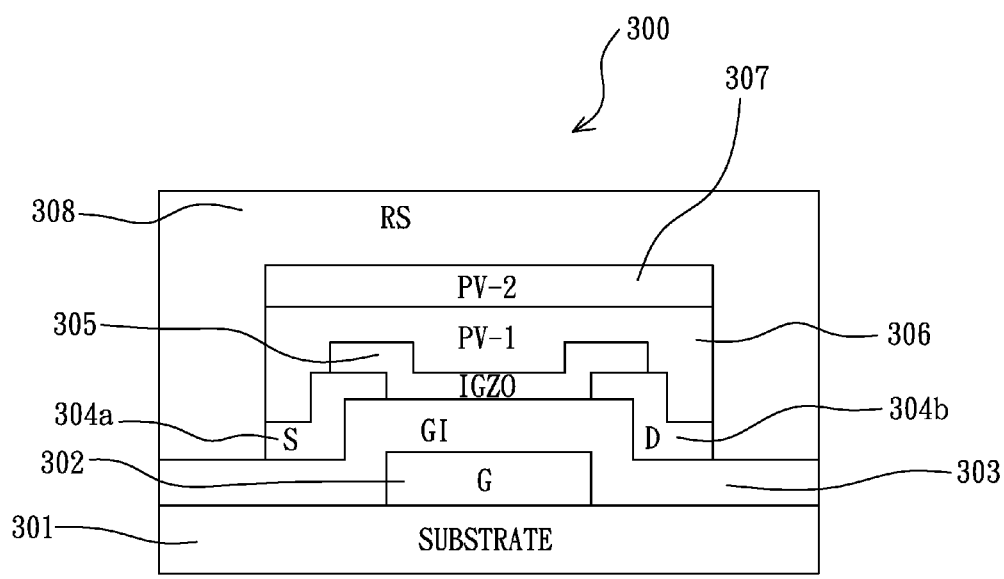
FIG. 5 illustrates a sectional view of a metal oxide semiconductor structure according to another preferred embodiment of the present invention.

Please refer to FIG. 5, which illustrates a sectional view of a metal oxide semiconductor structure according to another preferred embodiment of the present invention. As illustrated in the figure, the metal oxide semiconductor structure 300 includes a substrate 301, a gate electrode 302, a gate insulation layer 303, a source electrode 304a, a drain electrode 304b, an IGZO layer 305, a first passivation layer 306, a second passivation layer 307, and an opaque resin layer 308.

The substrate 301, of which the material includes glass or flexible plastics, is used for carrying the other compositions of the metal oxide semiconductor structure.

The gate electrode 302, made of metal—preferably an opaque metal, implemented by Mo/Cr alloy or Al/Nd alloy, for example—and deposited on the substrate 301, is used for coupling to a gate driving signal.

The gate insulation layer 303, being an insulation layer deposited over the gate electrode 302 and the substrate 301, has an upward bending portion in the middle region. The insulation layer including silicon oxides or silicon nitrides, is used for insulating the gate electrode 302 from the IGZO layer 305, the source electrode 304a, and the drain electrode 304b.

The source electrode 304a, made of metal and deposited at one side of the gate insulation layer 303, has a stair-stepping outline and is used for coupling to a source driving signal. The metal is preferably an opaque metal, implemented by Mo/Cr alloy or Al/Nd alloy, for example.

The drain electrode 304b, made of metal and deposited at another side of the gate insulation layer 303, has a stair-stepping outline and is used for coupling to a pixel electrode.

The metal is preferably an opaque metal, implemented by Mo/Cr alloy or Al/Nd alloy, for example.

The IGZO layer 305, being an N type semiconductor deposited over the source electrode 304a, the gate insulation layer 303, and the drain electrode 304b, and functioning as a channel, has a downward bending portion in the middle region.

The first passivation layer 306, being a first silicon compound layer deposited over the source electrode 304a, the IGZO layer 305, and the drain electrode 304b, possesses excellent insulating property. The first silicon compound layer preferably includes silicon oxides.

The second passivation layer 307, being a second silicon compound layer deposited over the first passivation layer 306, has a downward bending portion in the middle region and possesses excellent moisture-resistant and air-resistant properties. The second silicon compound layer preferably includes silicon nitrides—due to the fact that silicon nitride, of which the density is higher than that of silicon oxide, can provide better moisture-resistant and air-resistant effects.

The resin layer 308, being an opaque resin layer—preferably in black color—deposited over the source electrode 304a, the second passivation layer 307, and the drain electrode 304b, is used for forming a protection layer to prevent light, moisture, or dust from entering the structure.

According to foregoing specification, the present invention further proposes a method of making a metal oxide semiconductor structure, including the steps of: depositing a gate electrode on a substrate (step a); depositing a gate insulation layer over the gate electrode and the substrate (step b); depositing an IGZO layer on the gate insulation layer, wherein the IGZO layer functions as a channel (step c); depositing a source electrode at one side of the IGZO layer (step d); depositing a drain electrode at another side of the IGZO layer (step e); depositing a first passivation layer over the source electrode, the IGZO layer, and the drain electrode (step f); depositing a second passivation layer over the first passivation layer (step g); and depositing an opaque resin layer over the source electrode, the second passivation layer, and the drain electrode (step h).

In step a, the material of the substrate includes glass or flexible plastics, and the deposited gate electrode is preferably made of an opaque metal—Mo/Cr alloy or Al/Nd alloy, for example.

In step b, the deposited gate insulation layer has an upward bending portion in the middle region, and the insulation layer includes silicon oxides or silicon nitrides.

In step c, the deposited IGZO layer is an N type semiconductor layer, and has an upward bending portion in the middle region.

In step d, the deposited source electrode has a stair-stepping outline, and is preferably made of an opaque metal—Mo/Cr alloy or Al/Nd alloy, for example.

In step e, the deposited drain electrode has a stair-stepping outline, and is preferably made of an opaque metal—Mo/Cr alloy or Al/Nd alloy, for example.

In step f, the deposited first passivation layer has a downward bending portion in the middle region, and preferably includes silicon oxides.

In step g, the deposited second passivation layer has a downward bending portion in the middle region, and preferably includes silicon nitrides.

In step h, the deposited opaque resin layer is preferably in black color.

According to foregoing specification, the present invention proposes another method of making a metal oxide semiconductor structure, including the steps of: depositing a gate electrode on a substrate (step a); depositing a gate insulation layer over the gate electrode and the substrate (step b); depositing a source electrode at one side of the gate insulation layer (step c); depositing a drain electrode at another side of the gate insulation layer (step d); depositing an IGZO layer over the source electrode, the gate insulation layer, and the drain electrode, wherein the IGZO layer functions as a channel (step e); depositing a first passivation layer over the source electrode, the IGZO layer, and the drain electrode (step f); depositing a second passivation layer over the first passivation layer (step g); and depositing an opaque resin layer over the source electrode, the second passivation layer, and the drain electrode (step h).

In step a, the material of the substrate includes glass or flexible plastics, and the deposited gate electrode is preferably made of an opaque metal—Mo/Cr alloy or Al/Nd alloy, for example.

In step b, the deposited gate insulation layer has an upward bending portion in the middle region, and the insulation layer includes silicon oxides or silicon nitrides.

In step c, the deposited source electrode has a stair-stepping outline, and is preferably made of an opaque metal—Mo/Cr alloy or Al/Nd alloy, for example.

In step d, the deposited drain electrode has a stair-stepping outline, and is preferably made of an opaque metal—Mo/Cr alloy or Al/Nd alloy, for example.

In step e, the deposited IGZO layer is an N type semiconductor layer, and has a downward bending portion in the middle region.

In step f, the deposited first passivation layer preferably includes silicon oxides.

In step g, the deposited second passivation layer preferably includes silicon nitrides.

In step h, the deposited opaque resin layer is preferably in black color.

Due to the novel designs elaborated above, the present invention has the following advantages:

1. The opaque resin layer can prevent light from reaching the IGZO layer, thereby reducing photo leakage current.

2. The first passivation layer has excellent electrical insulating property, which can contribute to reducing leakage current of the channel.

3. The second passivation layer has excellent moisture-resistant and air-resistant properties, which can contribute to preventing the degradation of the IGZO layer.

In conclusion, the metal oxide semiconductor structure of the present invention can provide multi protections including light shielding, moisture resisting, and air resisting, for reducing leakage current, so the present invention does conquer the flaws of the prior art thin film transistors.

While the invention has been described by way of example and in terms of preferred embodiments, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

In summation of the above description, the present invention herein enhances the performance than the conventional structure and further complies with the patent application requirements and is submitted to the Patent and Trademark Office for review and granting of the commensurate patent rights.

What is claimed is:

1. A metal oxide semiconductor structure, comprising:
   a substrate;

a gate electrode, being made of metal and deposited on said substrate, for coupling to a gate driving signal;

a gate insulation layer, being an insulation layer deposited over said gate electrode and said substrate;

an IGZO layer, being an In—Ga—Zn—O layer deposited on said gate insulation layer, for functioning as a channel;

a source electrode, being made of metal and deposited at one side of said IGZO layer, for coupling to a source driving signal;

a drain electrode, being made of metal and deposited at another side of said IGZO layer, for coupling to a pixel electrode;

a first passivation layer, being a first silicon compound layer deposited over said source electrode, said IGZO layer, and said drain electrode;

a second passivation layer, being a second silicon compound layer, the second silicon layer is a single continuous layer deposited over and completely covering an upper surface of said first passivation layer, said first silicon compound layer and said second silicon compound layer are different compounds; and a resin layer, said resin layer being an opaque resin layer deposited over and directly connected to said source electrode, said first passivation layer, said second passivation layer, and said drain electrode.

2. The metal oxide semiconductor structure as claim 1, wherein said substrate comprises a material selected from a group consisting of glass and flexible plastics.

3. The metal oxide semiconductor structure as claim 2, wherein said gate electrode comprises an alloy selected from a group consisting of Mo/Cr alloy and Al/Nd alloy.

4. The metal oxide semiconductor structure as claim 3, wherein said gate insulation layer has an upward bending portion and comprises a silicon compound selected from a group consisting of a silicon oxide and a silicon nitride.

5. The metal oxide semiconductor structure as claim 4, wherein said IGZO layer has an upward bending portion.

6. The metal oxide semiconductor structure as claim 5, wherein said source electrode has a stair-stepping outline and comprises an alloy selected from a group consisting of Mo/Cr alloy and Al/Nd alloy.

7. The metal oxide semiconductor structure as claim 6, wherein said drain electrode has a stair-stepping outline and comprises an alloy selected from a group consisting of Mo/Cr alloy and Al/Nd alloy.

8. The metal oxide semiconductor structure as claim 7, wherein said first passivation layer has a downward bending portion and said first silicon compound layer comprises a silicon oxide.

9. The metal oxide semiconductor structure as claim 8, wherein said second passivation layer has a downward bending portion and said second silicon compound layer comprises a silicon nitride.

10. The metal oxide semiconductor structure as claim 9, wherein said resin layer is in black color.

11. The metal oxide semiconductor structure as claim 4, wherein said IGZO layer has a downward bending portion.

* * * * *